United States Patent
Haufe (10) Patent No.: US 8,549,369 B2
(45) Date of Patent: Oct. 1, 2013

(54) SEMICONDUCTOR-BASED TEST DEVICE THAT IMPLEMENTS RANDOM LOGIC FUNCTIONS

(75) Inventor: Christian Haufe, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 313 days.

(21) Appl. No.: 13/116,961

(22) Filed: May 26, 2011

(65) Prior Publication Data

US 2012/0304030 A1 Nov. 29, 2012

(51) Int. Cl.
*G01R 31/28* (2006.01)

(52) U.S. Cl.
USPC ............................ 714/728; 714/739

(58) Field of Classification Search
USPC ................. 714/724, 738, 741, 742, 728, 739; 324/750.25
See application file for complete search history.

(56) References Cited

U.S. PATENT DOCUMENTS

| | | | | |
|---|---|---|---|---|
| 6,557,128 B1 * | 4/2003 | Turnquist | ...................... | 714/724 |
| 6,662,327 B1 * | 12/2003 | Rajski | ........................... | 714/738 |
| 6,922,803 B2 * | 7/2005 | Nakao et al. | ................... | 714/738 |
| 7,434,104 B1 * | 10/2008 | Skeoch et al. | .............. | 714/38.11 |
| 7,755,374 B2 * | 7/2010 | Cojocneanu et al. | .... | 324/750.25 |

* cited by examiner

*Primary Examiner* — David Ton
(74) *Attorney, Agent, or Firm* — Ingrassia Fisher & Lorenz, P.C.

(57) ABSTRACT

A semiconductor-based test device includes a plurality of testing clusters and a pseudorandom global stimulus source coupled to the testing clusters. Each testing cluster includes a plurality of data registers and logic elements configured to perform random logic functions for generating test data for the plurality of data registers. The pseudorandom global stimulus source generates a pseudorandom binary stimulus for the logic elements. At least some of the plurality of testing clusters are coupled together to support inter-cluster fan-out and fan-in of data register output.

20 Claims, 3 Drawing Sheets

SEMICONDUCTOR-BASED TEST DEVICE THAT IMPLEMENTS RANDOM LOGIC FUNCTIONS

TECHNICAL FIELD

Embodiments of the subject matter described herein relate generally to semiconductor devices. More particularly, embodiments of the subject matter relate to a semiconductor-based test structure that can be used to test the suitability of semiconductor fabrication processes and/or cell libraries.

BACKGROUND

Semiconductor devices, fabrication processes for manufacturing semiconductor devices, and associated test circuits and test structures are well known. On-chip test architectures are often used to check certain characteristics of a semiconductor device (such as a device that implements logic functions using cell libraries) manufactured by a particular process. In this regard, the on-chip test structure is fabricated using the proposed manufacturing process and/or with certain cell libraries to be investigated. Consequently, the on-chip test structure can be exposed to controlled test conditions (e.g., high temperature operating life (HTOL) tests, scan chain tests, radiation tests) to determine how other devices fabricated in accordance with the same process technology might react to the same conditions.

Conventional on-chip test architectures are typically fabricated using symmetric structures that result in symmetric process test patterns. Symmetric patterns tend to repeat only a subset of all possible layout structures. Therefore, when ramping up a manufacturing process using a test design that covers only a subset of all possible layout structures, the process will be optimized to yield only for this subset of layout structures. Afterwards, when manufacturing customer designs that employ the full set of possible layout structures, process yield may unexpectedly go down and production of that customer product may be delayed by an undesirably long time. Accordingly, it is desirable to employ a test design that covers as many layout structures as possible.

Moreover, conventional on-chip test architectures may not be very flexible in nature, i.e., easily able to accommodate different test chip sizes, different process technologies, different cell libraries, and the like. Accordingly, it is desirable to have an efficient and effective semiconductor-based test structure that does not rely on symmetric structures. Moreover, it is desirable to have a configurable on-chip test structure that can be flexibly implemented so as to accommodate a variety of different chip sizes, process technologies, and the like. Furthermore, other desirable features and characteristics will become apparent from the subsequent detailed description and the appended claims, taken in conjunction with the accompanying drawings and the foregoing technical field and background.

BRIEF SUMMARY

An exemplary embodiment of a semiconductor-based test device is provided. The test device includes a plurality of testing clusters, each having a plurality of data registers and logic elements configured to perform random logic functions for generating test data for the plurality of data registers. The test device also includes a pseudorandom global stimulus source coupled to the plurality of testing clusters and configured to generate a pseudorandom binary stimulus for the logic elements. At least some of the plurality of testing clusters are coupled together to support inter-cluster fan-out and fan-in of data register output.

Another embodiment of a semiconductor-based test device is also provided. The test device includes a testing cluster and a pseudorandom global stimulus source coupled to the testing cluster. The testing cluster includes a plurality of data registers, each configured to generate a respective register output, and logic elements configured to perform random logic functions for generating test data for the plurality of data registers. The register output from a subset of the plurality of data registers serves as feedback to the logic elements. The pseudorandom global stimulus source is configured to generate a pseudorandom binary stimulus for the logic elements.

Also provided is another exemplary embodiment of a semiconductor-based test device. The test device has a plurality of testing clusters, each including a plurality of register circuits driven by random logic. The test device also has a pseudorandom global stimulus source coupled to the plurality of testing clusters and configured to generate a pseudorandom binary stimulus for the random logic. Each of the plurality of register circuits includes: logic elements configured to receive the pseudorandom binary stimulus and register feedback data as inputs, and configured to perform a random function for generating test data; and a flip-flop coupled to receive the test data as a flip-flop data input, the flip-flop configured to generate a clocked flip-flop data output in response to the flip flop data input. At least some of the clocked flip-flop data output from a first testing cluster of the plurality of testing clusters serves as the register feedback data for at least some of the logic elements in a second testing cluster of the plurality of testing clusters.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The subject matter presented here relates to a flexible and universal semiconductor-based test structure that can be used to develop, monitor, and test semiconductor manufacturing processes, including those that are under development. The test structure can be designed in a way that emulates the designs of production devices and chips that might be fabricated by a semiconductor manufacturing facility. Moreover, the test structure need not implement or deploy the actual customer design or any proprietary third-party technology. In practice, the test structure presented here can be easily adapted to any test chip size, standard cell library, or design process. Moreover, the test structure may incorporate an integrated debug feature to facilitate effective and easy debugging and device screening. The test structure may be used for logic yield learning and monitoring of new semiconductor fabrication processes, to test new cell libraries, and/or to develop new electronic design automation (EDA) tools.

The test structure itself can be fabricated as a semiconductor device, i.e., as a test chip. In this regard, the test chip is preferably fabricated such that it includes or emulates certain aspects and features of foundry customer designs including, without limitation: implementation using industry standard automated place and route tools (SAPR); random digital logic using flip-flops and logic gates (standard cells); high utilization of placement area and routing tracks; and no reoccurrence of symmetric patterns. In addition, the design of the test structure is very flexible with respect to a number of factors, including, without limitation: the manufacturing process and technology used to fabricate the test chip; the standard cell library to be used; and the test chip dimensions (e.g., width, length, area, and metal stack configuration). For use as a yield-learning vehicle, the test structure contains structures that support features such as, without limitation: scan chain fault debugging; logic fault debugging; and HTOL testing.

Figure 1:
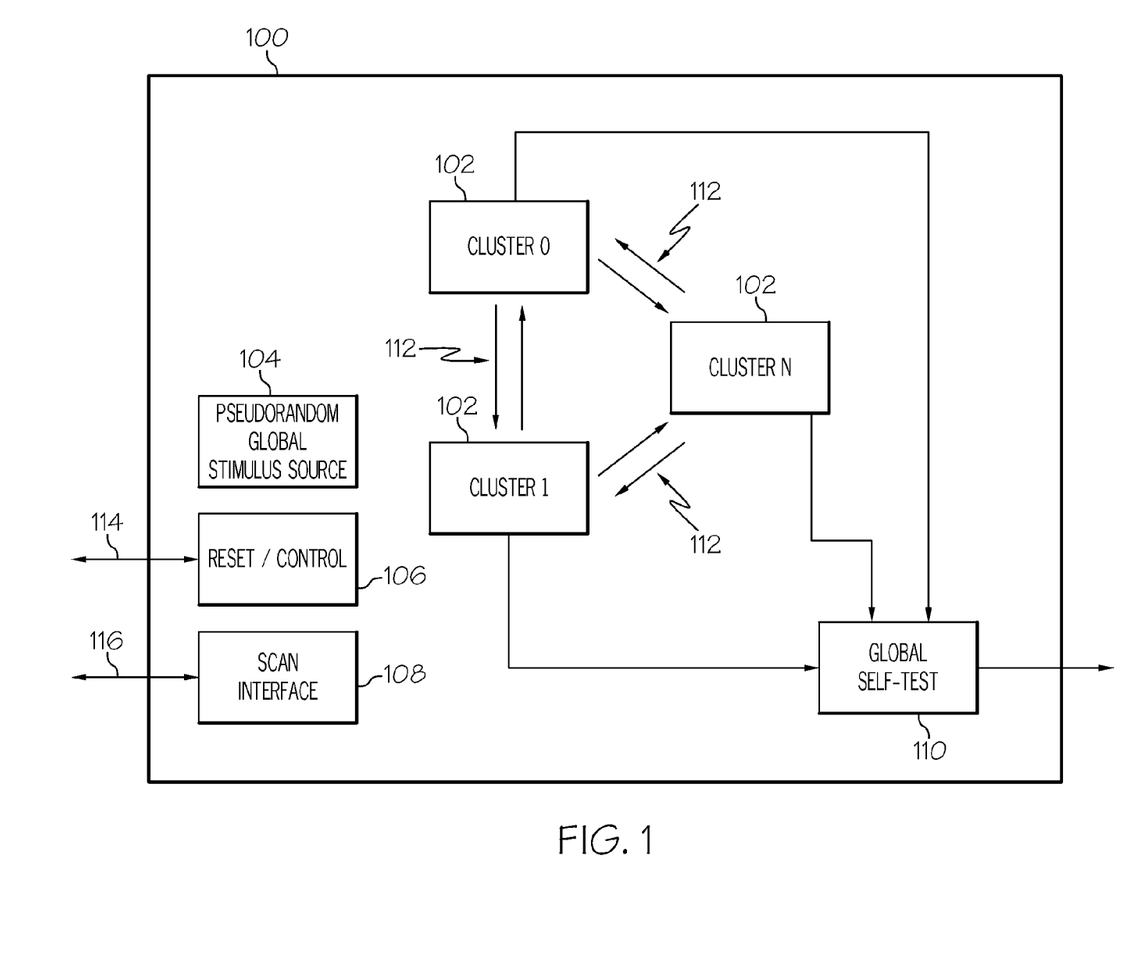
FIG. 1 is a schematic block diagram representation of an exemplary embodiment of an on-chip test system.

Referring now to the drawings, FIG. 1 is a schematic block diagram representation of an exemplary embodiment of an on-chip test system 100. The test system 100 is realized as a semiconductor device fabricated on a semiconductor substrate using an appropriate manufacturing process. The test system 100 is fabricated using a semiconductor process technology that is being evaluated, investigated, developed, or otherwise subject to testing. In other words, the test system 100 is designed and manufactured to accommodate testing and evaluation of the fabrication process technology. In practice, the test system 100 includes structures and elements that are fabricated in accordance with the same techniques and technology to be used to fabricate actual production devices.

This particular embodiment generally includes, without limitation: one or more testing clusters 102 (typically a plurality of testing clusters 102); a pseudorandom global stimulus source 104 coupled to the testing clusters 102; a reset/control module 106 coupled to the testing clusters 102; a scan interface 108 coupled to the testing clusters 102; and a global self-test module 110 coupled to the testing clusters 102. For ease of illustration and clarity, FIG. 1 does not depict any interconnections or couplings associated with the pseudorandom global stimulus source 104, the reset/control module 106, or the scan interface 108.

Any number of testing clusters 102 (including only one) may be realized in an embodiment of the test system 100. Each testing cluster 102 represents a logical cluster as well as a physical cluster that occupies an area of the test chip. As explained in more detail below, the testing clusters 102 utilize random functions (implemented by digital logic elements) that influence data register inputs during a testing mode of operation. In one non-limiting embodiment, the test system 100 includes one hundred testing clusters 102. As depicted in FIG. 1, at least some of the testing clusters 102 include fan-in and fan-out connections 112 that facilitate communication and cooperation between the individual testing clusters 102. Thus, at least some of the testing clusters 102 are coupled together to support inter-cluster fan-out and inter-cluster fan-in of data register output. More specifically, selected data register output(s) from one testing cluster 102 may be routed to another testing cluster 102 to influence the input to the data registers in the other testing cluster 102. As described in more detail below, fan-in data received by a receiving testing cluster 102 may be subjected to a random function that determines the bit states for the input to the data registers in the receiving testing cluster 102.

The pseudorandom global stimulus source 104 generates and provides a pseudorandom binary stimulus signal to the testing clusters 102. The pseudorandom global stimulus source 104 employs a pseudorandom number generator to generate the pseudorandom output stream. In practice, the pseudorandom global stimulus source 104 may be realized as a linear feedback shift register (LFSR). The output of the pseudorandom global stimulus source 104 is preferably a predictable but non-trivial stream of bits. Alternatively, the output could be a multi-bit pseudorandom data stream. As explained in more detail below, each testing cluster 102 has a plurality of data registers, and a subset (or all) of the registers in a testing cluster 102 is stimulated by the pseudorandom binary stimulus signal. The pseudorandom binary stimulus signal is continuously applied, and may change with each clock cycle.

The test system 100 can support an HTOL test mode, during which the test system 100 is operated while being clocked at high temperature and voltage. While operating in the HTOL test mode, the test system 100 is continuously stimulated by the output of the pseudorandom global stimulus source 104; the pseudorandom binary signal is fed to an appropriate number of data registers to ensure that sufficient activity is sustained during the HTOL test mode. In certain embodiments, for example, all data registers of the test system 100 are stimulated by the pseudorandom global stimulus source 104.

Moreover, for the exemplary embodiment described here, the pseudorandom global stimulus source 104 can be reset as needed to begin the pseudorandom sequence of bits. For example, the pseudorandom global stimulus source 104 may be reset periodically based on a predetermined number of clock cycles. For this particular embodiment, the pseudorandom global stimulus source 104 is reset once every 2,048 clock cycles along with all of the data registers of the test system 100 (during the testing mode of the test system 100). Thus, the pseudorandom global stimulus source 104 effectively presents a sequence of 2,048 bits. Moreover, the predictable nature of the pseudorandom binary signal allows the test system 100 to be self-stimulated in a deterministic manner using the same repeatable bit pattern.

The reset/control module 106 represents the devices, elements, and/or logic that are responsible for or otherwise facilitates various clocking, resetting, testing, and debugging features and functions of the test system 100. Although depicted as a distinct block in FIG. 1, the reset/control module 106 may be implemented in a distributed manner throughout the testing clusters 102. The arrow 114 in FIG. 1 may represent any number of links or paths for various control signals, clock signals, data signals, or the like. The reset/control module 106 is configured to place the test system 100 into a reset state to reset and initialize the test logic implemented in the testing clusters 102 as needed. For the exemplary embodiment presented here, the reset/control module 106 includes or cooperates with a counter to periodically reset the data registers in the test system 100 once every 2,048 clock cycles. Periodic resetting in this manner ensures that the test system 100 operates within a predictable and verifiable operating condition. The reset/control module 106 also enables preloading of the test registers (to logic high or logic low states) to facilitate scan chain debugging.

In this regard, the pseudorandom global stimulus source 104 and the reset/control module 106 together function as a "pacemaker" for the test system 100. In this regard, the pseudorandom binary stimulus signal ensures that the registers toggle randomly, while the periodic reset ensures that the test system does not get "stuck" after a large (and, therefore, not verifiable) amount of clock cycles. For example, a 32-bit LFSR has $2^{32}-1$ states. A 100 MHz clock would take 43 seconds to step through all of these states. A test structure of 10,000 data registers has $2^{10000}$ different states. Using a 100 MHz clock to step through all these states would take up to $6.3 \times 10^{2994}$ years, and simulation would be several orders of magnitude slower, given that a simulation speed of 100 cycles per second would require approximately $4.4 \times 10^7$ seconds (sixteen months) to step through all test structure states as defined by the 32-bit LFSR. Thus, the amount of test structure states to simulate is artificially limited by adding the periodic reset every 2,048 clock cycles in order to achieve simulation run times in the range of several minutes only (simulation speed depends on the test design size).

The scan interface 108 can be utilized for manufacturing fault and yield debugging and testing. In certain embodiments, the scan interface 108 is configured to accommodate a scan chain that propagates through the testing clusters 102. The scan interface 108 may be realized using conventional and standardized technology for handling scan signals such as Scan Data In, Scan Data Out, Scan Clock, and Scan Enable. In this regard, the arrow 116 in FIG. 1 may represent any number of links or paths that accommodate the various scan-related signals. In certain embodiments, the scan interface 108 accommodates level sensitive scan design (LSSD) technology, MUX-D technology, or the like.

The global self-test module 110 is coupled to each of the testing clusters 102 to obtain "local" self-test data from the testing clusters 102. The global self-test module 110 may be implemented with logic elements, devices, and/or other elements as desired. The global self-test module 110 is utilized to confirm whether or not the test system 100 is functioning properly (preferably in such a way that does not require use of the scan interface 108 or while the test system is being HTOL tested). As explained more fully below with reference to FIG. 2, each testing cluster 102 includes its own self-test logic that samples the current values of some or all of the data registers in the cluster and continuously generates a checksum. Each testing cluster 102 sends its self-test checksum to the global self-test module 110, which in turn continuously generates a global checksum value that is based upon or is otherwise derived from the local checksum values. The global self-test module 110 may be configured and controlled to periodically generate a global checksum value (for example, once every 2,048 clock cycles). Differences between simulated and measured global checksum values can be used to identify manufacturing defects in the test system 100.

The precision of the global self-test module 110 will depend on the randomness of the feedback within the testing clusters 102, the fan-in and fan-out between the testing clusters 102, as well as the random functions chosen to implement the test system 100. For the exemplary embodiment described here, a binary sum (XOR) is calculated from the register output values sampled locally in the testing clusters 102, and a 16-bit cyclic redundancy check (CRC) of the XOR sum is continuously generated. Each testing cluster 102 sends one bit of its 16-bit CRC to the global self-test module 110. These bits are again subjected to an XOR operation, and a 32-bit CRC is computed. The 32 bits of this CRC are then used as the overall self-test result for the test system 100.

Fault localization for the test system 100 can be achieved with a fault-to-checksum table. In practice, each identifiable fault will have an entry in the table. The table may be created using fault modeling and simulation techniques to generate the expected checksum for a specific fault in simulation. For the exemplary embodiment described here, the test system 100 was simulated for 2048 clock cycles after reset, after which the checksum value was sampled. This approach resulted in a stuck-at detection coverage of approximately 98.6% for all register stuck-at faults.

Figure 2:
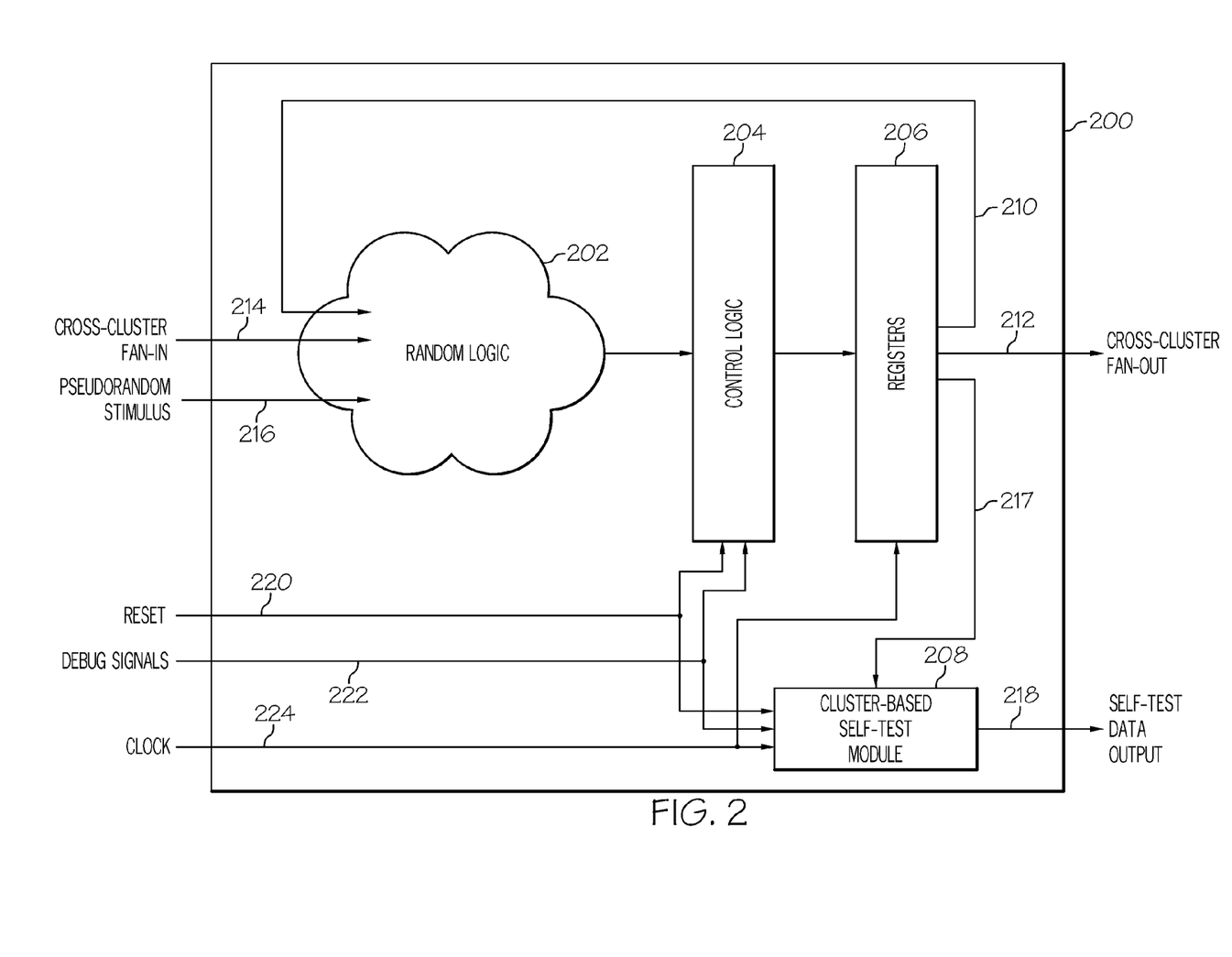
FIG. 2 is a schematic block diagram representation of an exemplary embodiment of a testing cluster suitable for use with the on-chip test system shown in FIG. 1.

FIG. 2 is a schematic block diagram representation of an exemplary embodiment of a testing cluster 200 that is suitable for use with the test system 100. FIG. 2 depicts the testing cluster 200 in a generic manner, and it should be appreciated that each testing cluster 102 shown in FIG. 1 may be generally configured and implemented as shown in FIG. 2. The illustrated embodiment of the testing cluster 200 includes, without limitation: random logic 202; control logic 204; a plurality of registers 206; and a cluster-based self-test module 208. Although the general structure and arrangement depicted in FIG. 2 is shared by all of the testing clusters 102 in the test system 100, the implementation and configuration of the random logic 202, the implementation and configuration of the control logic 204, the number and arrangement of registers 206, and the implementation and configuration of the cluster-based self-test module 208 may vary across the different testing clusters 102.

The plurality of registers 206 may include any number of individual data registers, which may be realized, for example, as flip-flops. The plurality of registers 206 may be implemented as a register bank or as any collection or group of registers 206 for the testing cluster 200. The specific number of data registers that comprise the plurality of registers 206 may vary from one testing cluster to another. In practice, the plurality of registers 206 may include thousands of individual data registers coupled together. As schematically depicted in FIG. 2, the register output from some of the registers 206 or any subset of the registers 206 can be fed back to the random logic 202 of the testing cluster 200 by way of a local feedback path 210 (as explained below, however, this type of local cluster feedback is optional for any given testing cluster). This local feedback path 210 enables the register output of one or more of the registers 206 in the testing cluster 200 to influence the subsequent state of the plurality of registers 206. As explained in more detail with reference to FIG. 3, the local feedback path 210 may represent a path from the register output of one particular register back to the random logic associated with that particular register. Alternatively, the local feedback path 210 may represent a path from the register output of one particular register of the testing cluster 200 back to the random logic associated with another register of the testing cluster 200.

The testing cluster 200 also accommodates (optional) cross-cluster fan-out. In this regard, the arrow 212 in FIG. 2 represents one or more fan-out links or paths that lead to other testing clusters in the test system. The arrow 212 may represent a plurality of different fan-out links or paths associated with any number of the registers 206. In practice, the data output of some (but not all) of the registers 206 can serve as fan-out data to other testing clusters. More specifically, the output data from some of the registers 206 can be fed to the random logic of one or more "neighbor" testing clusters by way of the cross-cluster fan-out connections. The cross-cluster fan-out enables the output of one or more of the registers 206 in the testing cluster 200 to influence the states of the registers in other testing clusters. Similarly, the testing cluster 200 accommodates (optional) cross-cluster fan-in data received from one or more neighbor testing clusters on the same test chip. The arrow 214 in FIG. 2 represents a plurality of different fan-in links or paths associated with the registers of neighboring testing clusters. As schematically depicted in FIG. 2, the fan-in data is routed to the random logic 202 of the testing cluster 200.

For this exemplary embodiment, the random logic 202 also receives the output of the pseudorandom global stimulus source 104 (see FIG. 1). The arrow 216 in FIG. 2 represents one or more links or paths that could be used to route the pseudorandom binary signal from the pseudorandom global stimulus source 104 to the random logic 202. In certain embodiments, the pseudorandom binary stimulus is fed to the random function or logic of each data register in the test system (see FIG. 3).

The testing cluster 200 also includes the cluster-based self-test module 208, which is coupled to the global self-test module 110 shown in FIG. 1. The cluster-based self-test module 208 samples some or all of the registers 206 and, in response thereto, generates data for the global self-test module 110 (as described above with reference to FIG. 1). In a typical implementation, the cluster-based self-test module 208 only samples a certain percentage of the registers 206 selected for purposes of generating the local self-test data output. In this regard, FIG. 2 depicts data output 217 from the registers 206 leading to the cluster-based self-test module 208. The arrow 218 in FIG. 2 represents the local self-test data output for the testing cluster 200. This self-test data output is provided to the global self-test module 110 for use as an input to generate the global self-test checksum.

The testing cluster 200 may be reset as needed using a reset signal 220. As depicted in FIG. 2, the reset signal 220 may be routed to the control logic 204 and to the cluster-based self-test module 208. In response to a reset command (i.e., an instruction or a reset bit), the control logic 204 configures the testing cluster 200 such that the registers 206 can be loaded with known reset values (i.e., default bit states). In addition, a reset command functions to reset the cluster-based self-test module 208. Resetting the cluster-based self-test module 208 initializes the global self-test checksum as needed or desired. More specifically, all the data registers inside the cluster-based self-test module 208 are reset to a known state. The cluster-based self-test module 208 is reset whenever the registers 206 are reset. As mentioned above, such resetting occurs every 2,048 clock cycles for the exemplary embodiment. In addition, the global self-test module 110 (see FIG. 1) is also reset whenever the cluster-based self-test module 208 is reset. In practice, all of the data registers (flip-flops) in the global self-test module 110 are reset, with the possible exception of the flip-flops that sample and hold the state of the 32-bit CRC inside the global self-test module 110 after each 2,048 clock cycle period. This sampled value may be the output of the global self-test module 110. This output is stable for the next period of 2,048 clock cycles and reflects a self-test result of the immediately preceding period of 2,048 clock cycles. Once the next period of 2,048 cycles has finished, the self-test result of this period will be sampled and kept stable for the next 2,048 clocks, and so on.

The testing cluster 200 may also receive debug signals 222, which can be used by the control logic 204 and/or the cluster-based self-test module 208. Referring to FIG. 1, the debug signals 222 may be provided on the links or paths represented by the arrow 114. The debug signals 222 may include, without limitation, preload data for the registers 206, preload enable signals, debug clock signals, and the like. When the preloading function is enabled, the preload data is used to place the registers 206 into preloaded states. The preload data may also be provided to the cluster-based self-test module 208. In this regard, all of the registers 206 and any flip-flops used in the pseudorandom global stimulus source 104, the reset/control module 106, the global self-test module 110, and the cluster-based self-test module 208 will be connected to scan chains in order to test these flip-flops for manufacturing defects. Therefore, any of these flip-flops may break a scan chain. Accordingly, the debug signals 222 (also identified by reference numbers 326 and 328 in FIG. 3) are identical for all flip-flops in the aforementioned modules. Every one of these flip-flops may have multiplexers (see reference numbers 304 and 306 in FIG. 3) in front of their data input node. However, for the pseudorandom global stimulus source 104, the reset/control module 104, the global self-test module 110, and the cluster-based self-test module 208, the reset default value is a well-defined, non-random number that matches the actual function of that register (e.g., a zero in order to reset the counter inside the reset/control module 106 to all zero bits). In addition, the pseudorandom global stimulus source 104, the reset/control module 106, the global self-test module 110, and the cluster-based self-test module 208 do not implement random functions. Instead, these modules utilize a signal to actually implement the desired function of that module (e.g., when implementing an increment counter in the reset/control module 106, the signal will be the new bit values for each bit depending on the current state of all counter bits).

The clock signal 224 may be provided on the links or paths represented by the arrow 114 (FIG. 1). The clock signal 224 controls the toggling of the registers 206 and the timing of the cluster-based self-test module 208. In practice, the registers in all of the testing clusters 102 of the test system 100 use a common clock signal 224.

The control logic 204 determines the source of data provided to the registers 206 of the testing cluster 200. More specifically, the control logic 204 regulates whether the data inputs to the registers 206 are the default reset values, preload (debug) values, or random values obtained from the random logic 202. As shown in FIG. 2, the output of the random logic 202 is provided to the registers 206 via the control logic 204. As described in more detail below with reference to FIG. 3, the control logic 204 may be implemented with one or more multiplexers to select which data streams are to be fed to the registers 206 as respective inputs.

When operating in the test mode, the random logic 202 randomly determines the next values of the registers 206. Although FIG. 2 depicts the random logic 202 as a single cloud, an embodiment of the testing cluster 200 may employ many distinct modules or sections of logic that collectively form the random logic 202. For example, each individual data register of the plurality of registers 206 may have its own random logic function associated therewith, where the random logic function randomly determines the next bit value of the data register after the next clock cycle.

For ease of description and to avoid cluttering the drawing, FIG. 2 does not depict any elements, signals, or logic associated with the scan chain mode of operation. Scanning features and functionality will be described later with reference to FIG. 3. It should be apparent from the following description that each testing cluster in the test system 100 can be designed and configured to accommodate scanning operations.

Figure 3:
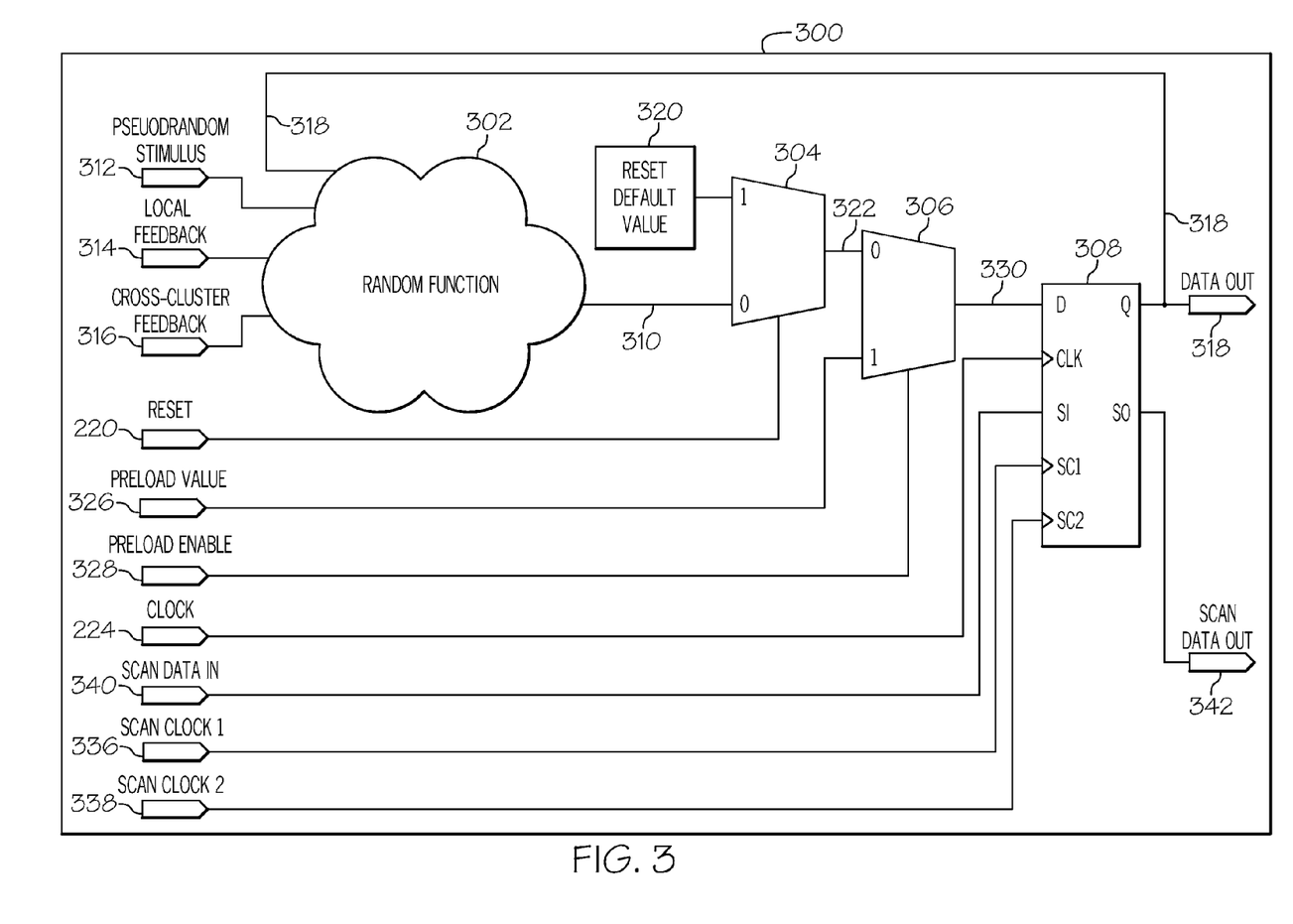
FIG. 3 is a schematic block diagram representation of an exemplary embodiment of a register circuit suitable for use with the test cluster shown in FIG. 2.

FIG. 3 is a schematic block diagram representation of an exemplary embodiment of a register circuit 300 suitable for use with the testing cluster 200 shown in FIG. 2. The registers 206 of the testing cluster 200 may include any number of register circuits 300, each configured and controlled as described below. The illustrated embodiment of the register circuit 300 generally includes, without limitation: a random function 302; a first multiplexer 304; a second multiplexer 306; and a flip-flop 308.

The random function 302 represents any number of logic elements, devices, circuit components, or hardware that are designed and configured to operate in a random manner to generate a digital output 310 that represents test data for use by the flip-flop 308. In this context, the random function 302 may be implemented with any number of register-level logic elements. The random function 302 is implemented as a random Boolean function using digital logic gates and elements. Thus, the random function 302 corresponds to or is otherwise associated with the flip-flop 308, and each register circuit implemented in the test system 100 has its own respective random function associated therewith. To ensure enough signal toggling during HTOL testing, the random function 302 should be chosen such that for each input signal X of the Boolean function there exists at least one combination of values of the remaining function inputs such that toggling the value of X will toggle the output value of the Boolean function.

Although random, the digital output 310 is influenced by a number of inputs (stimuli) to the random function 302. The illustrated implementation of the random function 302 is influenced by one or more of the following inputs: a pseudorandom stimulus 312, namely, the output of the pseudorandom global stimulus source 104 (FIG. 1); local feedback data 314 obtained from one or more flip-flops located in the same testing cluster as the register circuit 300; cross-cluster feedback data 316 obtained from one or more flip-flops located in other testing clusters (i.e., testing clusters other than the one in which the register circuit 300 is located); and the current data output 318 of the flip-flop 308. In practice, therefore, the digital output 310 will be a random function of the pseudorandom stimulus 312, the local feedback 314, the cross-cluster feedback 316, and/or the data output 318. As explained previously, the test system 100 preferably utilizes a vast number of different random functions. In other words, the same random function is not repeated for each and every register of the test system 100.

For this particular implementation and embodiment, the pseudorandom stimulus 312 is not utilized as a stimulus to each and every random function 302 in the test structure. Instead, the pseudorandom stimulus 312 is present only for a selected subset of the registers 206 (see FIG. 2). In theory, the pseudorandom stimulus 312 could be a multi-bit wide signal, but in practice it will be a single-bit signal. The respective signals for the local feedback data 314, the cross-cluster feedback data 316, and the current data output 318 serve as inputs for each and every random function 302. In practice, the local feedback data 314 and the cross-cluster feedback data 316 each may have any width from zero to multiple bits, however, the sum of the bits provided by the local feedback data 314 and the cross-cluster feedback data 316 must be greater than or equal to one bit. The current data output 318 is a one-bit signal that reflects the current state of a given register circuit 300. On average, about half of the random functions 302 in the test structure will use the respective current data output 318 as a stimulus (direct local feedback).

When the pseudorandom stimulus 312 is utilized, all of the inputs to the random function 302 are applied concurrently (simultaneously). The pseudorandom stimulus 312 is useful to drive the random nature of the register circuit 300. If, for example, only the local feedback data 314, the cross-cluster feedback data 316, and the current data output 318 are used to drive the various random functions 302, then too many of the random functions 302 (or blocks of random functions 302 coupled together) could be implemented that are constant, or that are oscillating with a very short period of only a few clock cycles. In this regard, the period of the pseudorandom global stimulus source 104 (see FIG. 1) is $2^{32}-1$ cycles. Using this long-period pseudorandom stimulus 312 as an input to at least a subset of the random functions 302 highly reduces the likelihood of having constant functions or those that oscillate with a short period.

The first multiplexer 304 and the second multiplexer 306 (and possibly other elements or logic) are included in the cluster-level control logic 204 depicted in FIG. 2. Accordingly, the control logic 204 might include a large number of multiplexers as needed to support a plurality of different register circuits. The first multiplexer 304 is coupled between the random function 302 and the flip-flop 308. The first multiplexer 304 has a first selectable input for a reset default value 320 and a second selectable input for the digital output 310 of the random function 302. The reset signal 220 (see also FIG. 2) can be used to select either the reset default value 320 or the digital output 310 for use as the first multiplexer output 322. While operating in the test mode, the reset signal 220 is set to logic low and the first multiplexer 304 is controlled such that the digital output 310 of the random function 302 is selected as the first multiplexer output 322. To reset the register circuit 300, however, the reset signal 220 is set to logic high and the first multiplexer 304 is controlled such that the reset default value 320 is selected for use as the first multiplexer output 322. The reset default value 320 represents a randomly selected but known (and constant) logic value assigned to the register circuit 300. In other words, once defined, the reset default value 320 remains fixed for the register circuit 300. Accordingly, when the test system 100 is reset, all of the registers in the test system 100 will be populated with their respective reset default values.

The second multiplexer 306 has a first selectable input that corresponds to the first multiplexer output 322, and a second selectable input for a preload value 326. A preload enable signal 328 is used to select either the first multiplexer output 322 or the preload value 326 for use as the second multiplexer output 330. While operating in the test mode, the preload enable signal 328 is held at logic low and the second multiplexer 306 is controlled such that the first multiplexer output 322 (which corresponds to the digital output 310 of the random function 302 during the test mode) is selected as the second multiplexer output 330. For the resetting operation, the preload enable signal 328 is set to logic low and the second multiplexer 306 is controlled such that the second multiplexer output 330 corresponds to the first multiplexer output 322, which in turn corresponds to the reset default value 320. Consequently, when resetting the register circuit 300, the reset default value 320 serves as the data input (D) to the flip-flop 308, and the flip-flop 308 is reset to its known reset value. For the preloading (debugging) operation, however, the preload enable signal 328 is set to logic high such that the second multiplexer output 330 corresponds to the preload value 326. Accordingly, the preload value 326 serves as the data input (D) to the flip-flop 308, and the flip-flop 308 can be preloaded with a known debug value for use with scan chain testing.

Although not always required, the exemplary embodiment described here employs standard LSSD devices for the flip-flops 308. As is well understood, an LSSD flip-flop is equivalent to a D-type flip-flop with data scanning capabilities. To this end, the flip-flop 308 includes a data input (D), a data output (Q), and a clock input (CLK) to support the D-type flip-flop functionality. The flip-flop 308 also includes a scan input (SI), a scan output (SO), a first scan clock input (SC1) and a second scan clock input (SC2) to support the data scanning functionality. The design, functionality, and operation of LSSD devices are well known and, therefore, will not be described in detail here. In summary, the flip-flop 308 can be selectively controlled to operate in a "normal" data latch mode or a scan mode. For normal operation, SC1 and SC2 are held at logic low (to effectively disable the scanning feature) and the clock signal 224 toggles the data input (D) state to the data output (Q) state, as is well understood. In this manner, the flip-flop 308 generates a clocked flip-flop data output in response to its flip-flop input data. For scanning operation, the clock signal 224 is held at logic low (to effectively disable the normal data toggling function) and SC1 and SC2 are used to control the shifting of the scan chain data from SI to SO.

The data input (D) of the flip-flop 308 is coupled to receive the second multiplexer output 330, and the data output (Q) of the flip-flop 308 corresponds to the data output 318. As mentioned previously, the data output (Q) of the flip-flop 308 may also be coupled to any number (including zero) of other register circuits in same testing cluster in which the register circuit 300 is located, and/or to any number (including zero) of other register circuits in one or more testing clusters other than the testing cluster in which the register circuit 300 is located. The clock signal 224 (see also FIG. 2) is coupled to the clock input (CLK) of the flip-flop 308, and the clock signal 224 serves as the data toggle signal for the flip-flop 308, as is well understood.

Notably, the data output (Q) of the flip-flop 308 could be used to drive the various feedback (fan-out) signals of the register circuit 300. In this regard, the data output (Q) of the flip-flop 308 may (but need not) be fed back to the random function 302 of the same register circuit 300, may (but need not) be fed back to the random function of a different register circuit in the same testing cluster, and/or may (but need not) be fed back to the random function of a register circuit in a different testing cluster. Depending upon the particular implementation and design, the data output (Q) of the flip-flop 308 could be fed back to the random functions of a plurality of register circuits, in the same or different testing cluster as the register circuit 300. The data output (Q) of the flip-flop 308 may also be routed to the cluster-based self-test module 208 of the testing cluster 200 in which the register circuit 300 resides (see FIG. 2). In this regard, it should be appreciated that the cluster-based self-test module 208 need not (and preferably does not) receive the data output from each and every flip-flop in the testing cluster 200. Rather, the cluster-based self-test module 208 samples only a subset of the flip-flops in the testing cluster 200 (for example, one out of every hundred flip-flops). This sampling is based on the assumption that a failure in one flip-flop will result in an error propagated to other flip-flops in the testing cluster 200, such that there is no need to analyze all of the flip-flops in the testing cluster 200.

As mentioned above, the second multiplexer 306 is used to support scan chain testing and debugging of the test system 100. In this mode of operation, the flip-flop 308 is preloaded with its defined and known preload value 326 (similarly, all other flip-flops in the test system 100 are preloaded with their respective preload values). After the flip-flops have been preloaded, the test system 100 is operated in the scan mode so that the scan chain can be read out to determine whether or not there are any "breaks" in the intended scan chain. Thus, the flip-flop 308 is controlled to operate as a shift register to pass along the scan chain from SI to SO. During the scanning mode, a first scan clock signal 336 and a second scan clock signal 338 cause the flip-flop 308 to shift the scan chain. In this context, the scan data input signal 340 of the flip-flop 308 may be obtained from a previous flip-flop in the scan chain, and the scan data output signal 342 of the flip-flop 308 may be provided to the next flip-flop in the scan chain. The scan interface 108 (FIG. 1) may accommodate the scan clock signals 336, 338, a scan data input, and the final scan data output signal, as is well understood.

As mentioned previously, the test system 100 can be designed and implemented as needed to suit the testing needs and to accommodate various practical considerations related to the intended semiconductor fabrication technology. As a result of the flexible nature of the test system 100, a number of design constraints and variables can influence the actual configuration, inter-cluster relationships, and intra-cluster relationships in a deployed implementation. Accordingly, a "design generator" can be utilized to contemplate the various optional or variable elements and other flexible aspects of the test system 100. An exemplary embodiment of the design generator, which may be realized as a computer-implemented application or software program, operates using some or all of the following design constraints and parameters: how many testing clusters to implement; how many flip-flops or registers to use; how many (and the type of) register feedback paths to generate; the ratio of cross-cluster feedback paths versus intra-cluster feedback paths; the amount of registers to be stimulated by the pseudorandom binary signal; the amount of registers to be sampled for checksum computation (during self-test).

Based on these constraints, the design generator distributes the total number of data registers over all of the testing clusters, distributes the pseudorandom stimulus points, and distributes the self-test sample points. The design generator may also randomly select the reset default values for the flip-flops, and determine the cross-cluster and intra-cluster feedback routing. The design generator then selects the random Boolean functions for all of the data registers, and tests the random logic functions to ensure that they satisfy the stated design objectives. As a result, the output of the design generator represents the particular design and layout for each cluster, the configuration of the random logic structures used in each cluster, the distribution of registers throughout the clusters, and the randomly generated data feedback paths. The result is an entirely random design structure that can be implemented using any Process Design Kit (PDK), any industry standard place and route tool, any standard cell library, and for any manufacturing process.

A practical embodiment of the test system 100 can be designed as follows. The various design constraints and parameters are provided as inputs to the design generator, which then creates the structures and elements based on the design constraints. Once the design (either register transfer level (RTL) or netlist description) is generated, it can be implemented using the given PDK, a given standard cell library, and a given SAPR toolset. The SAPR toolset provides layout data in an appropriate format that can be used for production of the physical test system 100.

Due to the fact that all design internals (reset values, random stimulus, and random functions) are well-defined (though randomly selected), the test system 100 behaves in a fully predictable manner following a reset. Accordingly, any behavioral anomaly (such as scan defects) can be matched to simulation data for debugging. As all other internals of the test system 100 are randomly selected, there is no need for excessive functional verification.

The test structure and related design techniques described above provide a number of benefits and advantages relative to existing and conventional approaches. For example, the fundamental design of the test structure is highly reusable across multiple semiconductor process technologies and design collaterals. Indeed, the test structure has a number of highly flexible design options, such as: scalable to any test chip size; any semiconductor manufacturing process can be used; any standard cell library can be used; and any existing SAPR tool can be used.

The test structure can be used to perform very close modeling of customer designs. To this end, certain implementations of the test structure include little to no symmetry and little to no duplicated structures. Moreover, the test structure may implement random logic in its test clusters. To accommodate accurate modeling of customer designs, the test structure supports adjustable routing congestion and ratio between local and global routing. In addition, the test structure supports adjustable design density and chip size, which can be useful for purposes of emulating a customer design.

The test structure presented herein also supports a debug feature that utilizes integrated self-testing for part screening without relying on scanning. To accommodate the debug feature, all of the flip-flops (registers) can be preloaded with known bit states. In addition, an industry standard scan interface can be utilized to facilitate ease of testing and debugging. These and other features of the test structure enable synchronous and predictable circuit behavior to compare the on-chip and in-silicon behavior to simulated behavior.

The test structure may be configured to be HTOL test ready. To this end, the test structure can implement a self-stimulating design that can be enabled during HTOL testing (using a clock signal and a periodic reset to toggle states during HTOL testing). Furthermore, the test structure can utilize an integrated checksum computation for easy speed degrading self testing.

In practice, the test structure can be implemented quickly and easily, which reduces overall testing time and cost. In this regard, the test structure requires little to no functional verification because the design is entirely generated using random structures. Normally, a design is implemented following a design specification. Depending on the design complexity, verifying the design implementation to match the design specification can be very time and resource consuming. Given that the test structure can be implemented using a design generator, it is sufficient to simply verify that the design generator is working correctly. If so, all generated designs are assumed to be correct. The generated output provides both design specification and design implementation at the same time. Accordingly, there is no more need to independently verify that the design is implemented according to its specification. Moreover, the particular design of a given test structure can be generated using a suitably written software tool such that little to no human interaction is required to derive the actual configuration of the test chip structures.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor-based test device comprising:
   a plurality of testing clusters, each of the plurality of testing clusters comprising:
      a plurality of data registers; and
      logic elements configured to perform random logic functions for generating test data for the plurality of data registers; and
   a pseudorandom global stimulus source coupled to the plurality of testing clusters and configured to generate a pseudorandom binary stimulus for the logic elements; wherein
   at least some of the plurality of testing clusters are coupled together to support inter-cluster fan-out and fan-in of data register output.

2. The semiconductor-based test device of claim 1, further comprising a reset-control module coupled to the plurality of testing clusters and configured to place the test device into a reset state to initialize the plurality of data registers with reset default values.

3. The semiconductor-based test device of claim 1, wherein:
   a first data register in a first testing cluster has a register output fed to the logic elements associated with a second data register in a second testing cluster; and
   test data generated by the logic elements associated with the second data register is influenced by the register output of the first data register.

4. The semiconductor-based test device of claim 1, wherein:
   a data register in a testing cluster has a register output fed to the logic elements associated with the data register; and
   test data generated by the logic elements associated with the data register is influenced by the register output of the data register.

5. The semiconductor-based test device of claim 1, wherein:
   a first data register in a first testing cluster has a register output fed to the logic elements associated with a second data register in the first testing cluster; and
   test data generated by the logic elements associated with the second data register is influenced by the register output of the first data register.

6. The semiconductor-based test device of claim 1, further comprising a scan interface configured to accommodate a scan chain that propagates through the plurality of testing clusters.

7. The semiconductor-based test device of claim 1, further comprising a global self-test module coupled to the plurality of testing clusters and configured to generate a global checksum value that is based on register outputs of selected ones of the plurality of data registers in the plurality of testing clusters.

8. The semiconductor-based test device of claim 7, wherein each of the plurality of testing clusters comprises a cluster-based self-test module coupled to the global self-test module to provide a cluster-based self-test output to the global self-test module.

9. The semiconductor-based test device of claim 1, wherein each of the plurality of data registers is associated with:

register-level logic elements configured to perform a random logic function for generating a digital output;
a flip-flop coupled to the register-level logic elements to obtain the digital output as a flip-flop data input, the flip-flop generating a clocked flip-flop data output in response to the flip-flop data input.

10. A semiconductor-based test device comprising:
a testing cluster comprising:
   a plurality of data registers, each configured to generate a respective register output; and
   logic elements configured to perform random logic functions for generating test data for the plurality of data registers, wherein register output from a subset of the plurality of data registers serves as feedback to the logic elements; and
a pseudorandom global stimulus source coupled to the testing cluster and configured to generate a pseudorandom binary stimulus for the logic elements.

11. The semiconductor-based test device of claim 10, further comprising a second testing cluster comprising a plurality of data registers, wherein the testing clusters are coupled together to support inter-cluster fan-out and fan-in of register output.

12. The semiconductor-based test device of claim 10, further comprising control logic to selectively configure the testing cluster for loading the plurality of data registers with reset default values.

13. The semiconductor-based test device of claim 10, further comprising control logic to selectively configure the testing cluster for loading the plurality of data registers with preload values for scan chain testing.

14. The semiconductor-based test device of claim 10, further comprising a cluster-based self-test module coupled to a subset of the plurality of data registers, the cluster-based self-test module configured to generate a local checksum value that is based on register outputs of the subset of the plurality of data registers.

15. The semiconductor-based test device of claim 10, wherein:
a first data register in the plurality of data registers has its register output fed to the logic elements associated with a second data register in the plurality of data registers; and
test data generated by the logic elements associated with the second data register is influenced by the register output of the first data register.

16. The semiconductor-based test device of claim 10, wherein:
a data register in the plurality of data registers has its register output fed to the logic elements associated with the data register; and
test data generated by the logic elements associated with the data register is influenced by the register output of the data register.

17. A semiconductor-based test device comprising:
a plurality of testing clusters, each of the plurality of testing clusters comprising a plurality of register circuits driven by random logic; and
a pseudorandom global stimulus source coupled to the plurality of testing clusters and configured to generate a pseudorandom binary stimulus for the random logic;
wherein each of the plurality of register circuits comprises:
   logic elements configured to receive the pseudorandom binary stimulus and register feedback data as inputs, and configured to perform a random function for generating test data; and
   a flip-flop coupled to receive the test data as a flip-flop data input, the flip-flop configured to generate a clocked flip-flop data output in response to the flip flop data input; and
wherein at least some of the clocked flip-flop data output from a first testing cluster of the plurality of testing clusters serves as the register feedback data for at least some of the logic elements in a second testing cluster of the plurality of testing clusters.

18. The semiconductor-based test device of claim 17, wherein each of the plurality of register circuits further comprises a multiplexer coupled between the logic elements and the flip-flop, the multiplexer comprising a first input for a reset default value and a second input for the test data, and the multiplexer being controlled to operate in a test mode during which the test data is provided as a multiplexer output and in a reset mode during which the reset default value is provided as the multiplexer output.

19. The semiconductor-based test device of claim 17, wherein at least a portion of the clocked flip-flop output data from the first testing cluster serves as the register feedback data for at least some of the logic elements in the first testing cluster.

20. The semiconductor-based test device of claim 17, wherein the flip-flop accommodates scan chain testing.

* * * * *